(12) United States Patent
Koerner et al.

(10) Patent No.: US 7,176,816 B2
(45) Date of Patent: Feb. 13, 2007

(54) CIRCUIT CONFIGURATION FOR ANALOG/DIGITAL CONVERSION

(75) Inventors: Gotthilf Koerner, Weissach (DE); Berthold Fehrenbacher, Markgroeningen (DE); Axel Breitmaier, Ammerbuch-Entringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/220,871

(22) Filed: Sep. 6, 2005

(65) Prior Publication Data

US 2006/0066465 A1   Mar. 30, 2006

(30) Foreign Application Priority Data

Sep. 25, 2004   (DE) .................. 10 2004 046 618

(51) Int. Cl.
    *H03M 1/10*   (2006.01)
(52) U.S. Cl. .................. 341/120; 341/118; 341/155
(58) Field of Classification Search .............. 341/120, 341/118, 155
    See application file for complete search history.

(56) References Cited

U.S. PATENT DOCUMENTS

| | | | | |
|---|---|---|---|---|
| 3,609,312 A | * | 9/1971 | Higgins et al. ............... 700/10 |
| 4,232,839 A | * | 11/1980 | Sicre et al. .................. 244/188 |
| 4,700,174 A | * | 10/1987 | Sutherland et al. ......... 341/120 |
| 4,833,445 A | * | 5/1989 | Buchele ...................... 341/118 |
| 5,047,770 A | * | 9/1991 | Engeler et al. ............. 341/120 |
| 5,272,627 A | * | 12/1993 | Maschhoff et al. ............. 378/4 |
| 5,319,370 A | * | 6/1994 | Signore et al. ............. 341/120 |
| 5,440,305 A | * | 8/1995 | Signore et al. ............. 341/120 |

FOREIGN PATENT DOCUMENTS

DE        196 31 972        2/1998

* cited by examiner

*Primary Examiner*—Jean Bruner Jeanglaude
(74) *Attorney, Agent, or Firm*—Kenyon & Kenyon LLP

(57) ABSTRACT

A circuit configuration for converting analog signals to digital signals, having a multiplexer which has a plurality of analog signal inputs, an address input that is several bits wide and an output, and which is configured to connect one of the analog signal inputs to the output when an address assigned to the respective analog signal input is applied to the address input, and having an analog/digital converter, whose input is connected to the output of the multiplexer in order to digitize the respective analog signal emitted at the output. The circuit configuration includes at least one test signal source for supplying a test signal to a subset of the analog signal inputs of the multiplexer. In addition, an address is assigned to each of the analog signal inputs of this subset, of whose bits one has a first binary value, and all the others have a second binary value that is different from the first.

12 Claims, 2 Drawing Sheets

| E1 | 0000 |
|---|---|
| E2 | 0001 |
| E3 | 0010 |
| E4 | 0011 |
| E5 | 0100 |
| E6 | 0101 |
| E7 | 0110 |
| E8 | 0111 |
| E9 | 1000 |
| E10 | 1001 |

Fig. 2

CIRCUIT CONFIGURATION FOR ANALOG/DIGITAL CONVERSION

FIELD OF THE INVENTION

The present invention relates to a circuit configuration for converting analog signals to digital signals, having a multiplexer which has a plurality of analog signal inputs, an address input several bits wide and an output, and which is configured to connect one of the analog signal inputs to the output when an address assigned to the respective analog signal input is applied to the address input, and having an analog/digital converter, whose input is connected to the output of the multiplexer in order to digitize the respective analog signal emitted at the output.

BACKGROUND INFORMATION

In practice, circuit configurations for analog/digital conversion have proven prone to errors. For example, software errors may have the effect that, instead of a desired address, a wrong address is applied to the address input, and because of that, instead of a desired analog signal, a wrong analog signal is converted. Or hardware faults, such as defective lines, may appear within the circuit configuration. For these reasons, it is necessary to monitor circuit configurations for converting analog signals to digital signals.

A method for monitoring a circuit configuration for analog/digital conversion is described in German Patent Application No. DE 196 31 972 C2. In this context, a sequence of digital pulses is generated, based on an analog signal that is to be digitized, of which at least the width or the repetition frequency are dependent on the analog signal.

Subsequently, it is checked whether this pulse frequency and a digital value, generated by the circuit configuration based on the same analog signal, correspond to each other. It is true that the circuit configuration may be checked for hardware faults, but no checking takes place of the correct addressing of one of several analog signal inputs.

Methods that permit checking a circuit configuration for analog/digital conversion for correct addressing of their analog signal inputs use, for example, known analog test signals which are temporarily applied to the analog signal inputs of the circuit configuration instead of useful signals. Using the sequential application of the addresses assigned to these analog signal inputs to the address input, the test signals present at the respective analog signal inputs are digitized, one after another, by the circuit configuration. Because known signals are involved as the test signals, the result of their conversion is known per se, so that, as the result of the conversion of a respective test signal, in each case a certain digital setpoint value may be expected. If the result of the conversion of one of the test signals leads to a different setpoint value than the one that was expected, this is evaluated as being an indication of the faultiness of the circuit configuration. However, in order to carry out such checking, a change-over of the circuit configuration into a test mode is required, in which the test signals are applied, instead of the useful signals that are otherwise converted, to the inputs of the circuit configuration, so that the conversion of the useful signals has to be interrupted while the circuit configuration carries out the checking. In particular, for this reason, repeated checking may not be carried out at short time intervals, but only at relatively long time intervals between the individual tests. Furthermore, the possibility exists, in the case of such circuit configurations, that a fault is diagnosed as to whether the conversion of the useful signals is proceeding correctly, only because the switchover to the test signals is interfered with.

One possibility for removing this problem is to provide a more or less identical circuit configuration parallel to the circuit configuration that is to be monitored, in each case both configurations converting the same analog signal, and in each case digital signals generated by the two configurations being compared to each other. However, the practical implementation of such monitoring using two circuit configurations requires double the technical expenditure, and, accordingly, it is costly. In addition, such a technical approach runs counter to the general trend towards miniaturization of circuits.

SUMMARY

An example embodiment of the present invention refines a circuit configuration in such a way that, in a simple manner, monitoring this circuit configuration for faults in the addressing of analog signal inputs and for hardware faults is made possible.

Because, according to one embodiment of the present invention, the specified test signals are strictly assigned in each case to such analog signals in whose addresses a single bit takes on the first bit value, and all other bits take on the second bit value, the addresses present at the address input may be checked, bit by bit, as to whether the bits are correctly taking on each binary value. If this has been ensured, one may assume with certainty that addresses, in which no bits or two or more bits have the second binary value, will be correctly present at the address input. Therefore, the analog signal inputs, whose address includes one bit having the first bit value, may durably receive the test signals and the other analog signal inputs may durably receive the useful signals; there is no necessity for an analog signal input optionally to receive a useful signal or a test signal.

Preferably, the number of inputs of the multiplexer connected to a test signal is equal to the bit number of the multiplexer's address input, so that each individual bit of the address input may be tested individually.

Useful signals that are to be converted, in which, as in the test signals, analog signals are involved, are preferably provided at inputs having addresses with regard to which at least two bits take on the first bit value.

If the analog signal input of a test signal is addressed, and this test signal is thereupon digitized, it supplies a digitized value which may be compared to an expected digital setpoint value. If these two values agree within specified values, the circuit configuration may, for one thing, be recognized as being free from hardware faults. On the other hand, the addressing of the analog input of this test signal may be recognized as being correct. Because, in the address assigned to this analog signal input, one bit takes on the first bit value and all other bits take on the second bit value, one may further conclude from this that, in the circuit configuration, this bit taking on the first bit value is able correctly to take on the first bit value, and that the other bits are able correctly to take on the second bit value.

Now, if the addressing of all analog signal inputs busy with test signals are tested throughout, and in this context no fault is discovered, this means, because the number of analog signal inputs connected to a test signal is equal to the bit number of their address input, that in the circuit configuration all address bits are able to take on correctly both the first and the second bit value. However, this means especially that even in the case of the address of any analog signal input, at which a useful signal is present, that is, an address in which more than one bit takes on the first bit value, these bits are able correctly to take on the first bit value in the circuit configuration, and the respective other bits of this address are also able correctly to take on the second bit value. Therefore, because this is the case, the addressing of this analog signal input within the circuit configuration has to take place correctly.

Especially preferred, the example circuit configuration includes, as test signal source, a voltage divider for picking off partial voltages of an operating voltage of the circuit configuration as test signals. Using this, the test signals may be generated especially simply. It is particularly preferred if each output of the test signal source that supplies a test signal is permanently wired to a corresponding analog signal input of the multiplexer. These analog signal inputs are not brought out of the circuit configuration, so that the useful signals to be converted by the circuit configuration are able to be applied from the outside only at the remaining analog signal inputs of the multiplexer. A mistaken application of a useful signal at an analog signal input, which is actually provided for a test signal, and which would lead to a faulty operation of the circuit configuration, is thus excluded.

It is quite especially preferred if test signals, present at respectively different analog signal inputs of the subset, supply different results of digitizing in the analog/digital converter. If the test signals are picked off as partial voltages by a voltage divider, these partial voltages are respectively selected of different magnitudes, so that the digitizing of each test signal supplies a respectively unique result to be assigned. Exchanges of bits in the address applied to the multiplexer may then be detected in that the result of the conversion corresponds to the conversion setpoint value of a test signal that was not addressed.

A comparator, of which a first input is connected to an output of the analog/digital converter, makes possible the comparison of results of the digitizing of a test signal to a specified digital setpoint value, in that the result of the digitizing of the test signal is applied by the analog/digital converter to this first input of the comparator, and the setpoint value is applied to a second input of the comparator. If the comparator determines a difference between the result of the digitizing of the test signal and the setpoint value assigned to this test signal, this is an indication that there is an error either in the addressing of the analog signal input of this test signal or in the connecting line between the multiplexer and the analog/digital converter.

Such an error may then be noted down as an error entry in an error register that may be provided in the circuit configuration. External control circuits, for example, may be entitled to access to this error register, which control a unit that includes the circuit configuration, so that this control may react appropriately to the error entries. In this context, an error entry may, for example, be made only if the difference exceeds a specified limit that is different from zero, in order to take into consideration possible conversion tolerances based on electronic noise within the circuit configuration.

Even more advantageously, the circuit configuration is designed to convert the analog signals, present at the analog signal inputs of the multiplexer, sequentially and/or cyclically. In sequential conversion, it is ensured that each of the analog signals present at one of the analog signal inputs, that is, both the useful signals and the test signals, are converted one after another, and checking of the circuit configuration takes place at least once, but preferably at the beginning of its operation, whereas in cyclical conversion such checking takes place permanently parallel to the operation of the circuit configuration.

The example circuit configuration preferably may include a memory having storage locations assigned to the analog signal inputs of the multiplexer, for storing the result of the digitizing of one of the analog signals by the analog/digital converter in a respective one of the storage locations, the circuit configuration being equipped to determine if one of the digital values generated from the test signals is read out from the memory, and to replace this read-out digital value in the respective storage location by a respective specified digital value. Advantageously, the specified digital values may be of a magnitude that is not reached by the converted test signals, so that, in the storage locations, they may be distinguished uniquely from a digital value received as a conversion result. Thereby, a failure of a sequence control for the circuit configuration may be detected in that one of the specified digital signals remains unchanged in its respective storage location, and is especially not replaced by a more recent conversion of the test signal assigned to this storage location, in the storage location. The specified digital value may be zero, that is, the storage location is deleted after the reading out of the digital value generated by the analog/digital converter, and remains in the deleted state until the appropriate test signal is more recently converted.

Advantageously, between the output of the multiplexer and the input of the analog/digital converter a reference voltage source for supplying a reference voltage may be provided at the input of the analog/digital converter. As the reference voltage, a voltage is then selected that is reached neither by the test signals nor by one of the useful signals. Besides, a resistance is selected as the internal resistance of the reference voltage source which is many times grater than the internal resistances of signal sources from which the analog signals originate, which is thus, in particular, also greater than the internal resistance of the test signal source. The reference voltage applied to the input of the analog/digital converter is superimposed on the respective analog signal that was input into the analog/digital converter as an interference signal, regardless of whether it is a useful signal or a test signal. Because, however, the internal resistance of the reference voltage source is selected to be very great relative to internal resistances of the signal sources for the analog signals, this superposition has no noticeable influence on the result of the digitizing. Only upon the appearance of a defective line, in such a way that the analog signal drops out and the reference voltage is present all by itself at the analog/digital converter, does one receive a value that is typical for this reference voltage, as the result of the conversion. In the light of the appearance of this value, a hardware fault in the circuit configuration may be detected independently of whether the multiplexer just happens to be emitting a useful signal or a test signal to the output.

In one example embodiment of the circuit configuration alternative to this, a switch is provided, using which the reference voltage supplied by the reference voltage source may optionally be applied to the input of the analog/digital converter.

At the multiplexer, an unconnected analog signal input may be provided, that is, an input at which no analog signal is present. Preferably, to the unconnected analog signal input there is assigned that address at which all bits take on the second bit value. If, using the switch, the reference voltage is applied to the input of the analog/digital converter, at the same time, the address of this unconnected analog signal input is applied to the address input of the multiplexer.

Therefore, no analog signal is emitted at the output by the multiplexer, and the analog/digital converter alone receives the reference voltage for conversion. Because, in this embodiment, the reference voltage is always applied at the input of the analog/digital converter, without superimposing an analog signal emitted by the multiplexer, the magnitude of the internal resistance of the reference voltage source is insignificant also in this embodiment. After the digitizing of the reference voltage, if the setpoint value expected for this voltage is obtained, this establishes the error-free functioning of the analog/digital converter.

BRIEF DESCRIPTION OF THE DRAWINGS

Additional features and advantages of example embodiments of the present invention are described below.

FIG. 2 shows a table in which the individual inputs of the multiplexer are shown with the bit addresses assigned to them.

DETAILED DESCRIPTION OF EXAMPLE EMBODIMENTS

Figure 1:
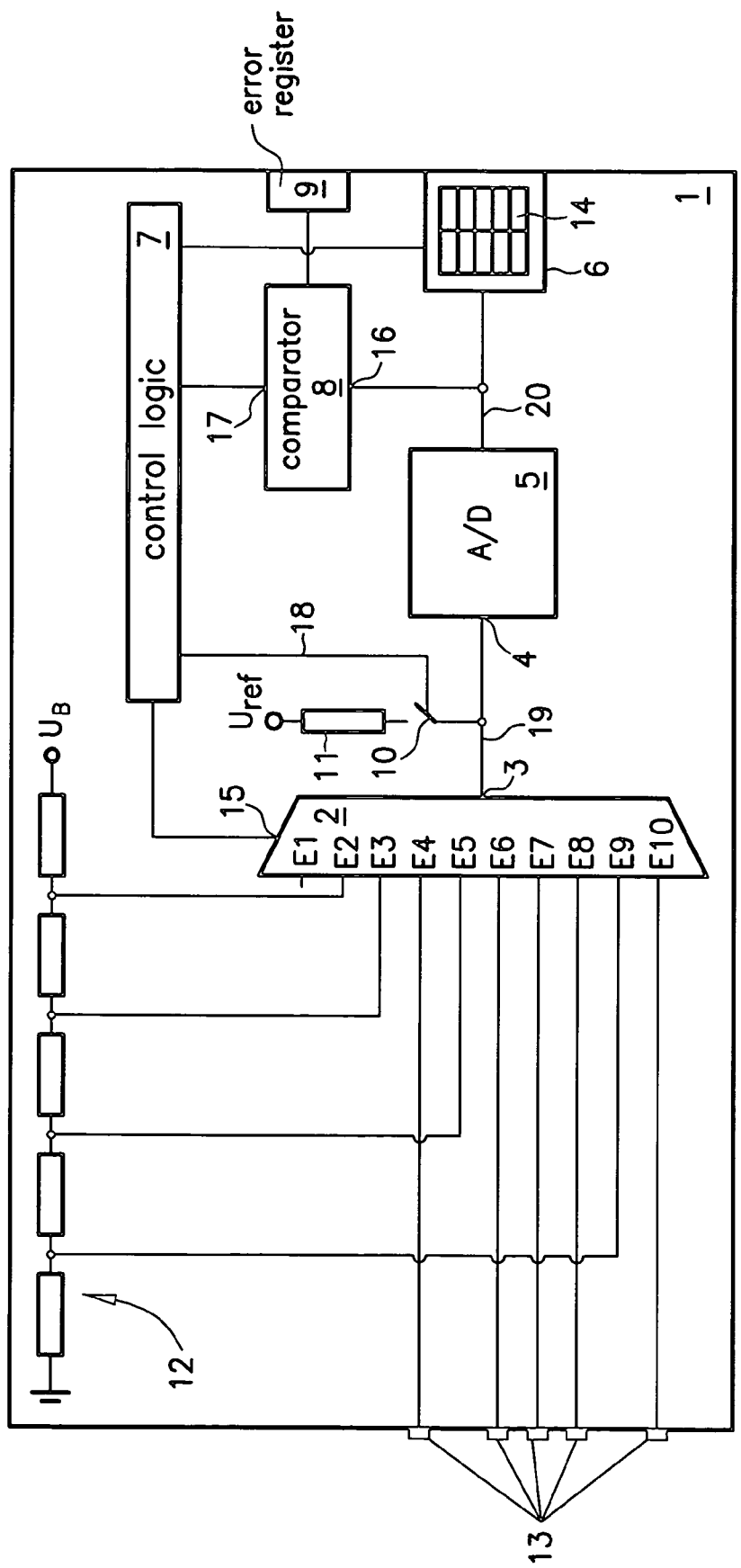
FIG. 1 shows an example circuit configuration according to the present invention.

FIG. 1 shows an example of a circuit configuration according to the present invention, that is constructed on a printed circuit board. The circuit configuration includes, for example, a multiplexer 2, having ten analog signal inputs E1–E10. The analog signal inputs E1–E10 are able to be addressed by a control logic 7 via a four bit-wide address input 15, in that the former applies an address, assigned to the respective analog signal input E1–E10, having four bits to address input 15. Output 3 of multiplexer 2 is in connection with an input 4 of an analog/digital converter 5 via a line 19, and analog/digital converter 5 is connected at its output end, in turn, to a memory 6. Memory 6 has ten different storage locations 14, of which each is uniquely assigned to one of analog signal inputs E1–E10. Control logic 7 is connected to memory 6, in a controlling manner. A first input 16 of a comparator 8 is connected to a connecting line 20 between analog/digital converter 5 and memory 6. In addition, a second input 17 of comparator 8 is connected to control logic 7. On the output side, comparator 8 is connected to an error register 9. A control line 18 leads from control logic 7 to a switch 10, to which control logic 7 may optionally connect a reference voltage source having an internal resistance 11, which supplies a reference voltage $U_{ref}$, to line 19 between output 3 of multiplexer 2 and input 4 of analog/digital converter 5.

In the table in FIG. 2, the assignment between analog signal inputs E1–E10 and the four bit wide addresses is shown. As one may see from the table of FIG. 4, it is common to analog signal inputs E2, E3, E5 and E9 that, in their addresses, in each case three bits take on the bit value 0 and in each case only one bit takes on the value 1.

As shown in FIG. 1, these analog signal inputs E2, E3, E5 and E9 are permanently connected to a voltage divider 12. Voltage divider 12 divides an operating voltage $U_B$ of the circuit configuration into four respectively different partial voltages, so that each of the analog signal inputs E2, E3, E5 and E9 respectively receives another of these partial voltages as an analog test signal. By contrast, analog signal inputs E4, E6, E7, E8 and E10 are respectively connected to external terminals 13 of the circuit configuration, via which, in each case, an analog useful signal is able to be input into the circuit configuration. Analog signal input E1, to which address 0000 is assigned, is unconnected.

If control logic 7 addresses one of analog signal inputs $E_i$ (where i=2, . . . , 10) as analog signal inputs E2–E10, the analog signal present at analog signal input $E_i$, which, in the case of inputs E4, E6, E7, E8 and E10 is a useful signal, and in the case of inputs E2, E3, E5 and E9 it is a test signal, it is transmitted, gets via output 3 to input 4 of analog/digital converter 5, is converted by it to a digital value, and this digital value is output by analog/digital converter 5 to memory 6, where it is stored in the respective storage location 14 that is uniquely assigned to analog signal input $E_i$.

Because the partial voltages present at analog signal inputs E2, E3, E5 and E9 as test signals each have specified, known levels, the digital values obtained in response to correct conversion are also known ahead of time. The knowledge of the expected digital values for these partial voltages, at error-free functioning of the circuit configuration, is utilized by control logic 7 for the functional checking of the circuit configuration. To do this, control logic 7 applies, for example, the digital setpoint value expected as a result of the conversion of the partial voltage present at analog signal input E5 to second input 17, that is connected to it, of comparator 8, while the digitizing result actually obtained after conversion of this partial voltage reaches comparator 8 via first input 16 of comparator 8 that is connected to connecting line 20 between analog/digital converter 5 and memory 6. Comparator 8 compares the expected digital setpoint value applied to it by control logic 7 and the digitizing result actually supplied by analog/digital converter 5 to each other. If these agree, or if a difference between them remains within a specified limit, there is no reaction by comparator 8. But, as soon as the two values differ from each other, or if a difference between the two exceeds the specified limit, comparator 8 sends a corresponding error message to error register 9. The error message may optionally also be sent to control logic 7. The error message obtained at error register 9 may, for example, be read out and evaluated by external circuits following the circuit configuration according to the present invention that is shown.

In a first embodiment of an operating method for the circuit configuration according to the present invention, at each initial operation of the circuit configuration or of a unit into which it is installed, control logic 7 addresses all analog signal inputs E2–E10 in sequence, so that the useful signals and test signals or partial voltages that are present at these analog signal inputs E2–E10 are sequentially converted to digital values by analog/digital 5, and are stored in the respective storage places 14 of memory 6, and possible errors are noted in error register 9.

According to a second embodiment of the operating method, during the operation of the circuit configuration or during the operation of a unit that includes the circuit configuration, control logic 7 cyclically addresses all the analog signal inputs E2–E10. Because, during the cyclical repetition of the conversion of the signals present at analog signal inputs E2–E10, at all times partial voltages or test signals present at analog signal inputs E2, E3, E5 and E9 are also converted, and, in the case of an error, an entry is made in error register 9, one may use this in a simple manner for a functional checking of the circuit configuration in parallel to the operation of the circuit configuration, without the operation of the circuit configuration having to be interrupted or restricted for the checking procedure.

If there is a suspicion of a malfunction in the addressing of a certain one of the analog signal inputs E2–E10, or of the interruption of connecting line 19 between multiplexer 2 and analog/digital converter 5, control logic 7 may cause, for example, due to a request from external circuits, a selective functional checking, even without a major effort. If, for example, there is the suspicion that the addressing of input E6 is in error having the address 0101, control logic 7 may selectively check the addressing of this input E6, using the partial voltages present at inputs E2 and E5. The control logic addresses analog signal input E2 using bit address 0001 and checks, in the manner described above, the correctness of the conversion of the partial voltage present at analog signal input E2. If this conversion takes place according to expectations, it is assured that, in the circuit configuration during addressing, the bit having a place value one may correctly take up the bit value 1, and the bits having the place values 3, 4 and 8 may correctly take up the bit value 0. Accordingly, control logic 7 carries out a checking of the conversion of the partial voltage present at analog signal input E5. Because bit address 0100 is assigned to input E5, in the case of a correct conversion of the partial voltage present at analog signal input E5 it is ensured that, in the circuit configuration during addressing, the bit having a place value four may correctly take on the bit value 1, and the bits having place values one, two and eight may correctly take on the bit value 0. Because, in the bit address of analog signal input E6, the bit having place value one and the bit having place value four take on a bit value 1, the non-occurrence of an error message in error register 9 or to control logic 7 after checking the addressing of analog signal inputs E1 and E5, one may conclude that there was a correct addressing of analog signal input E6.

In a second example embodiment of the operating method for the circuit configuration, control logic 7 is further designed to determine when digitizing results stored in storage locations 14 of memory 6 are read out. When digitizing results are read out from storage locations 14, which are assigned to analog signal inputs E2, E3, E5 and E9, corresponding storage location 14 is set to zero after the reading out of the digitizing results.

By contrast, storage locations 14 of memory 6 that are assigned to analog signal inputs E4, E6, E7, E8 and E10, in which the digitizing results are stored that were received after conversion of the useful signals present at these inputs, are not deleted after being read out, so that these data will still be available even after possibly occurring data losses in subsequent circuits that rely on theses data, and can be read out anew.

Because storage locations 14 of memory 6, that are assigned to analog signal inputs E2, E3, E5 and E9, are set to a known value or are deleted after the reading out of the digitizing results contained in them, it is possible to detect the occurrence of an error in a sequencing control executed by control logic 7 for the circuit configuration, if the specified values contained in these storage location 14 do not change any more during the operation of the circuit configuration.

Finally, control logic 7, for the purpose of checking the functioning of analog/digital converter 5, by throwing switch 10, is able to apply reference voltage $U_{ref}$, having internal resistance 11 to its input 4, while it applies to address input 15 of multiplexer 2 the address 0000 that is assigned to the unconnected analog signal input E1, so that the output of multiplexer 2 floats. Then the level at input 4 of analog/digital converter 5 is given exclusively by reference voltage $U_{ref}$. Because the reference voltage $U_{ref}$ is known, the result of the digitization generated in response to correct conversion by analog/digital converter 5 is also known for this reference voltage $U_{ref}$. In an analogous manner to that described above, with the aid of comparator 8, one may compare the actually obtained result of the digitization of reference voltage $U_{ref}$ to the result expected in response to a correct conversion, and, in the case of deviations between these two, one may conclude that there was an error in analog/digital converter 5 or in the line between switch 10 and input 4 of the converter. In such a case, a corresponding error message is again filed in error register 9. This checking of the functioning of converter 5 is carried out by control logic 7 especially if, during a preceding conversion of the test signals, digitizing results deviating from the respective setpoint value were obtained in the case of a plurality of the test signals.

What is claimed is:

1. A circuit configuration for converting analog signals to digital signals, composing:
    a multiplexer having a plurality of analog signal inputs, an address input that is several bits wide and an output, the multiplexer being configured to connect one of the analog signal inputs to the output when an address assigned to the respective analog signal input is applied to the address input;
    an analog/digital converter having an input connected to the output of the multiplexer to digitize the respective analog signal emitted at the output of the multiplexer; and
    at least one test signal source configured to supply a test signal to a subset of the analog signal inputs of the multiplexer,
    wherein to the analog signal inputs of the subset, in each case an address comprised of bits is assigned, of whose bits one has a first binary value and all the others have a second binary value that is different from the first binary value, and
    wherein only one address bit per signal input is set.

2. A circuit configuration for converting analog signals to digital signals, comprising:
    a multiplexer having a plurality of analog signal inputs, an address input that is several bits wide and an output, the multiplexer being configured to connect one of the analog signal inputs to the output when an address assigned to the respective analog signal input is applied to the address input;
    an analog/digital converter having an input connected to the output of the multiplexer to digitize the respective analog signal emitted at the output of the multiplexer; and
    at least one test signal source configured to supply a test signal to a subset of the analog signal inputs of the multiplexer;
    wherein to the analog signal inputs of the subset, in each case an address comprised of bits is assigned, of whose bits one has a first binary value and all the others have a second binary value that is different from the first binary value,
    wherein the test signal source includes a voltage divider for picking off a partial voltage of an operating voltage of the circuit configuration as a test signal.

3. The circuit configuration as recited in claim 1, wherein each output of the test signal source that supplies a test signal is permanently wired to a corresponding analog signal input of the subset.

4. The circuit configuration as recited in claim 1, wherein test signals, present at respectively different analog signal inputs of the subset, supply different results of the digitizing in the analog/digital converter.

5. A circuit configuration for converting analog signals to digital signals, comprising:
   a multiplexer having a plurality of analog signal inputs, an address input that is several bits wide and an output, the multiplexer being configured to connect one of the analog signal inputs to the output when an address assigned to the respective analog signal input is applied to the address input;
   an analog/digital converter having an input connected to the output of the multiplexer to digitize the respective analog signal emitted at the output of the multiplexer;
   at least one test signal source configured to supply a test signal to a subset of the analog signal inputs of the multiplexer,
   wherein to the analog signal inputs of the subset, in each case an address comprised of bits is assigned, of whose bits one has a first binary value and all the others have a second binary value that is different from the first binary value; and
   a comparator, a first input of the comparator being connected to an output of the analog/digital converter.

6. The circuit configuration as recited in claim 5, further comprising:
   a setpoint device configured to supply to a second input of the comparator a setpoint for a result of the digitizing of a test signal by the analog/digital converter.

7. The circuit configuration as recited in claim 6, further comprising:
   an error register into which an error entry is made if the comparator establishes a difference between a result of the digitizing of the test signal and a setpoint value assigned to the test signal.

8. The circuit configuration as recited in claim 7, wherein the error entry is made if the difference exceeds a specified limit that is different from zero.

9. The circuit configuration as recited in claim 1, wherein the circuit configuration is configured to convert the analog signals, present at the inputs of the multiplexer, at least one of sequentially and cyclically.

10. The circuit configuration as recited in claim 9, further comprising:
    a memory having storage locations assigned to the inputs of the multiplexer to store the result of the digitizing of one of the analog signals by the analog/digital converter in the respectively assigned storage location, the circuit configuration being configured to determine if a digital value generated from the test signals is read out from the memory, and to replace the read-out digital value in the respective storage location by a respectively specified digital value.

11. A circuit configuration for converting analog signals to digital signals, comprising:
    a multiplexer having a plurality of analog signal inputs, an address input that is several bits wide and an output, the multiplexer being configured to connect one of the analog signal inputs to the output when an address assigned to the respective analog signal input is applied to the address input;
    an analog/digital converter having an input connected to the output of the multiplexer to digitize the respective analog signal emitted at the output of the multiplexer;
    at least one test signal source configured to supply a test signal to a subset of the analog signal inputs of the multiplexer,
    wherein to the analog signal inputs of the subset, in each case an address comprised of bits is assigned, of whose bits one has a first binary value and all the others have a second binary value that is different from the first binary value; and
    a reference voltage source coupled between the output of the multiplexer and the input of the analog/digital converter to supply a reference voltage to the input of the analog/digital converter.

12. The circuit configuration as recited in claim 1, wherein a memory of the source is erased after being read out.

* * * * *